US010021774B2

(12) United States Patent
Shvartsman et al.

(10) Patent No.: US 10,021,774 B2
(45) Date of Patent: Jul. 10, 2018

(54) MAGNETIC FIELD COMPENSATION IN A LINEAR ACCELERATOR

(71) Applicant: ViewRay Technologies, Inc., Oakwood Village, OH (US)

(72) Inventors: Shmaryu M. Shvartsman, Highland Heights, OH (US); James F. Dempsey, Atherton, CA (US)

(73) Assignee: ViewRay Technologies, Inc., Oakwood Village, OH (US)

( * ) Notice: Subject to any disclaimer, the term of this patent is extended or adjusted under 35 U.S.C. 154(b) by 0 days.

(21) Appl. No.: 15/450,666

(22) Filed: Mar. 6, 2017

(65) Prior Publication Data

US 2017/0265290 A1 Sep. 14, 2017

Related U.S. Application Data

(60) Provisional application No. 62/305,970, filed on Mar. 9, 2016.

(51) Int. Cl.

| | |
|---|---|
| ***H05H 1/00*** | (2006.01) |
| ***H05H 1/16*** | (2006.01) |
| ***H05H 7/08*** | (2006.01) |
| ***H05H 7/12*** | (2006.01) |
| ***H05H 7/22*** | (2006.01) |
| ***H05H 9/00*** | (2006.01) |
| ***H05H 9/02*** | (2006.01) |
| ***H01J 27/02*** | (2006.01) |

(Continued)

(52) U.S. Cl.

CPC ................ *H05H 7/04* (2013.01); *H05H 7/14* (2013.01); *H05H 9/00* (2013.01)

(58) Field of Classification Search

None

See application file for complete search history.

(56) References Cited

U.S. PATENT DOCUMENTS 3,379,365 A 4/1968 Hait 4,397,611 A 8/1983 Wiesner (Continued)

FOREIGN PATENT DOCUMENTS

EP 0388123 A2 9/1990

JP 02304847 A 12/1990

(Continued)

OTHER PUBLICATIONS

Linac Groud, "A 90 Kev Electron Lina.c of IHEF", Proceedings of the 1986 International LINAC Conference, (19860901), pp. 505-507, XP055371635.

(Continued)

*Primary Examiner* — Dedei K Hammond

(74) *Attorney, Agent, or Firm* — Pillsbury Winthrop Shaw Pittman LLP

(57) ABSTRACT

A system has a linear accelerator, ion pump and a compensating magnet. The ion pump includes an ion pump magnet position, an ion pump magnet shape, an ion pump magnet orientation, and an ion pump magnet magnetic field profile. The compensating magnet has a position, a shape, an orientation, and a magnetic field profile, where at least one of the position, shape, orientation, and magnetic field profile of the compensating magnet reduce at least one component of a magnetic field in the linear accelerator resulting from the ion pump magnet.

14 Claims, 5 Drawing Sheets

(51) Int. Cl.

| | |
|---|---|
| ***H01J 27/04*** | (2006.01) |
| ***H01J 37/14*** | (2006.01) |
| ***H01J 41/20*** | (2006.01) |
| ***H05H 7/04*** | (2006.01) |
| ***H05H 7/14*** | (2006.01) |

(56) References Cited

U.S. PATENT DOCUMENTS 4,835,446 A * 5/1989 Nation .................... H05H 9/02
315/39
6,417,634 B1 * 7/2002 Bergstrom .............. H05H 7/02
313/62
7,808,182 B2 * 10/2010 New ...................... H01J 9/025
315/5.35

FOREIGN PATENT DOCUMENTS

JP 11297248 A * 10/1999
WO 2017155856 9/2017

OTHER PUBLICATIONS

PCT App. No. PCT/US2017/020878; International Search Report and Written Opinion dated Sep. 14, 2017.

* cited by examiner

MAGNETIC FIELD COMPENSATION IN A LINEAR ACCELERATOR

CROSS-REFERENCE TO RELATED APPLICATIONS

The current application claims priority under § 35 U.S.C. § 119(e) to U.S. Provisional Patent Application No. 62/305,970 filed Mar. 9, 2016 and entitled "MAGNETIC FIELD COMPENSATION IN A LINEAR ACCELERATOR," the contents of which are hereby incorporated by reference in its entirety.

TECHNICAL FIELD

The subject matter described herein relates to reducing the magnetic field inside a linear accelerator.

BACKGROUND

A linear particle accelerator (linac) can be used to accelerate charged subatomic particles or ions by subjecting them to a series of oscillating electric potentials in an acceleration chamber. In an exemplary linac application, the accelerated particles may be directed toward a target which, when struck by the particles, enables the generation of a photon beam that may be used in medical radiation therapy.

Typical linear accelerators include a particle source and an acceleration chamber that is kept under vacuum. In many linear accelerators, maintenance of the vacuum in the acceleration chamber is facilitated by a vacuum pump, for example, an ion pump. Many ion pumps include a Penning trap that confines electrons in the center of the Penning trap. The confined electrons then ionize gas particles that also enter the Penning trap. Once ionized, an electric field directs the ions to a getter that captures them, thus reducing the gas density in the linear accelerator.

SUMMARY

In a first aspect, a system can include a linear accelerator, and ion pump, and a compensating magnet. The ion pump can have an ion pump magnet position, an ion pump magnet shape, an ion pump magnet orientation, and an ion pump magnet magnetic field profile. The compensating magnet can have a position, a shape, an orientation, and a magnetic field profile. Also, at least one of the position, shape, orientation, and magnetic field profile of the compensating magnet reduces at least one component of a magnetic field in the linear accelerator resulting from the ion pump magnet.

In some variations, the orientation of the compensating magnet can be such that the magnetic field due to the ion pump magnet is substantially canceled in at least one location in the linear accelerator. Also, the linear accelerator can have an electron beam path and the reduction or cancellation of the magnetic field can be along the electron beam path.

In other variations, at least one of the position, shape, orientation, and magnetic field profile can be substantially similar to at least one of the ion pump magnet position, ion pump magnet shape, ion pump magnet orientation, and ion pump magnet magnetic field profile. Also, the compensating magnet can be a current carrying coil.

In other variations, the ion pump magnet and the compensating magnet can each have a C-shape, with each of the C-shapes having an opening. The openings of the ion pump magnet and the compensating magnet can face each other.

In other variations, at least one of the position, shape, orientation, and magnetic field profile of the compensating magnet can be configured to reduce a gradient of the magnetic field in the linear accelerator.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

When practical, similar reference numbers denote similar structures, features, or elements.

DETAILED DESCRIPTION

The subject matter of this application describes methods and systems for magnetic field compensation in a linear accelerator. References in this specification to "an embodiment," "one embodiment," and the like, mean that the particular feature, structure, or characteristic being described is included in at least one embodiment of the present subject matter. Occurrences of such phrases in this specification do necessarily all refer to the same embodiment.

Figure 1:
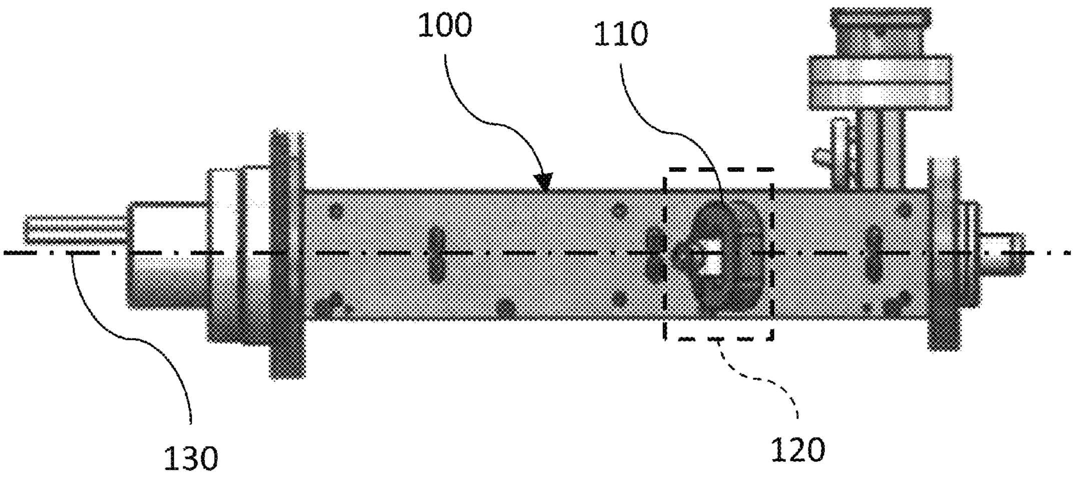
FIG. 1 is a side elevational view of an exemplary linear accelerator and ion pump magnet.

FIG. 1 is a side elevational view of a linear accelerator 100 and ion pump magnet 110. Linear accelerator 100 can include components such as particle sources, control systems, data acquisition systems, diagnostics, etc. Linear accelerator 100 can contain a standing wave field that accelerates a beam of electrons inside the linear accelerator. While shown and described herein as a linear accelerator accelerating electrons, the concepts described herein may be applied to any source of directed charged particles, electron beam sources, proton beam sources, etc.

A vacuum pump 120 can be connected to linear accelerator 100 to provide a vacuum. An electron beam can then travel unobstructed inside linear accelerator 100 along a central axis 130. In one implementation, vacuum pump 120 can be an ion pump. Ion pumps utilize electric and magnetic fields to ionize gas inside the ion pump and divert the ionized gases to collection plates or getters. In one implementation, ion pump 120 (indicated by the dashed line) can include an ion pump magnet 110. When an "ion pump magnet" is referred to herein it may refer to a single magnet design such as in FIGS. 1-4 or the term may refer to an ion pump magnet comprising multiple separate magnets such as in FIG. 5, or other designs. Ion pump magnet 110 can have an ion pump magnet position, ion pump magnet shape, ion pump magnet orientation, and ion pump magnet magnetic field profile.

Ion pump magnet position can be, for example, the location of ion pump magnet 110 relative to central axis 130 of the linear accelerator 100 or to any fixed point relative to linear accelerator 100.

Ion pump magnet shape can describe the overall shape or configuration of the ion pump magnet 110.

Ion pump magnet orientation can refer to the particular disposition of ion pump magnet 110 relative to a particular object, location, vector, etc. For example, ion pump magnetic orientation can describe ion pump magnet 110 being angled, mirrored, rotated, shifted, etc. Ion pump magnet orientation can also define an ion pump magnet polarity. One example of ion pump magnet polarity is shown in FIGS. 1-2 where the poles of ion pump magnet 110 are labeled.

Ion pump magnetic field profile can describe the strength and shape of the magnetic field resulting from ion pump magnet 110. Ion pump magnetic field profile can include a magnetic field that permeates other portions of ion pump 120, the linear accelerator 100, and any surrounding space or other components. One portion of an ion pump magnetic field profile 220 is illustrated in FIG. 2.

The magnetic field profile of ion pump 120, and magnetic fields from other sources, can affect the focusing and/or trajectory of the electron beam. This in turn can affect the quality of the beam and, for example, dose delivered to the patient during radiotherapy treatment. Electron beam homogeneity at a treatment location in a patient can be reduced by an electron beam that has been deviated or defocused by a magnetic field.

Figure 2:
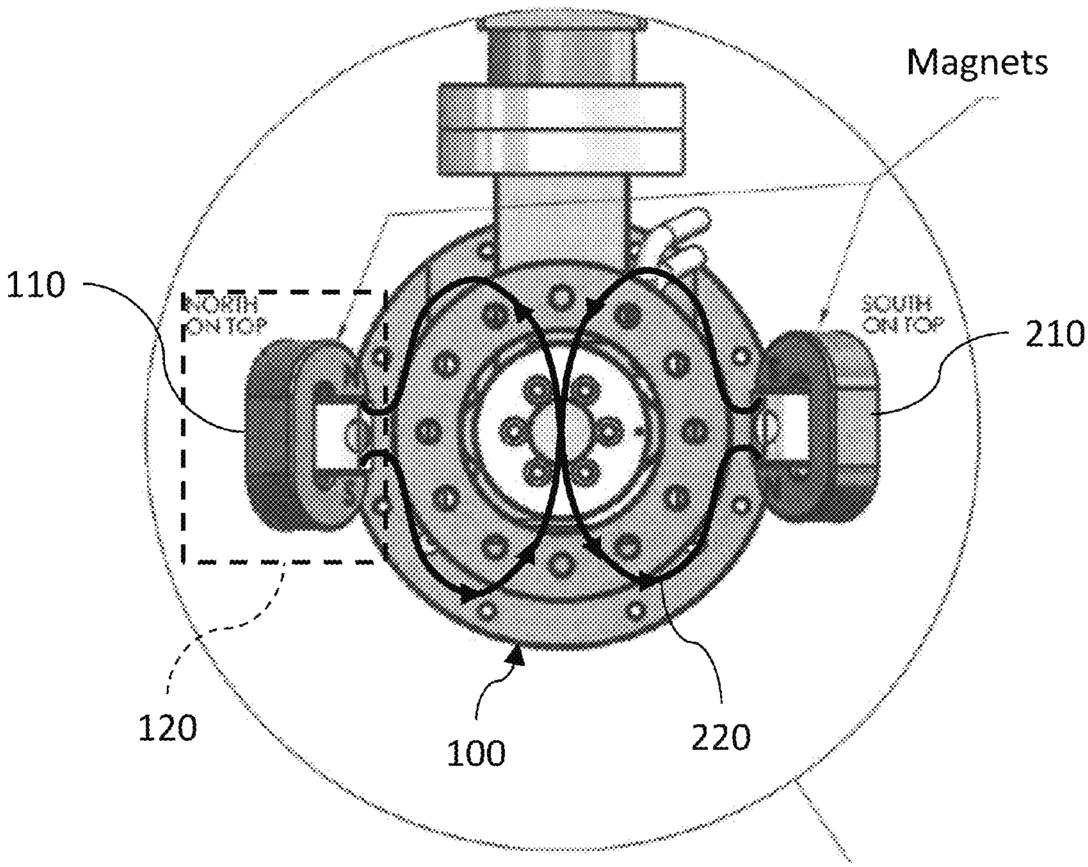
FIG. 2 is a rear elevational view of the exemplary linear accelerator, illustrating an ion pump magnet and an embodiment of a compensating magnet.

FIG. 2 is a rear elevational view of linear accelerator 100, illustrating an ion pump magnet 110 and a compensating magnet 210. Compensating magnet 210 can act, at some locations, to reduce the magnetic field due to ion pump magnet 110 and improve electron beam focusing or alignment. Like ion pump magnet 110, compensating magnet 210 also has a position, shape, orientation, and magnetic field profile. In one implementation, proper selection and configuration of position, shape, orientation, and/or magnetic field profile of compensating magnet 210 can reduce one or more components of the magnetic field in the linear accelerator 100 resulting from the ion pump magnet 110. The components of the magnetic field can be expressed in, for example, rectilinear vector components $\vec{B}_X$, $\vec{B}_Y$, and $\vec{B}_Z$. The magnetic field in the linear accelerator 100, as used herein, is the vector sum of all magnetic field sources, for example the ion pump magnet 110 and the compensating magnet 210, at any given point.

As illustrated in FIG. 2 by magnetic field lines 220, it can be seen that at least one component of the magnetic field resulting from ion pump magnet 110 has been reduced. In particular, orientation of compensating magnet 210 can be such that magnetic field due to ion pump magnet 110 can be substantially canceled in at least one location in linear accelerator 100. A magnetic field that is substantially canceled can have a zero magnitude or null in at least one location in space. Locations proximate to the null locations can have a net magnetic field that is small compared to the magnetic field in the absence of the compensating magnet.

With ion pump magnet 110 and compensating magnet 210 arranged with at least partial symmetry, the magnetic field can be reduced, or substantially canceled, along central axis 130 of linear accelerator 100. Due to magnetic field reduction along central axis 130 of linear accelerator 100 by compensating magnet 210, reduction in at least one component of the magnetic field can also occur along the electron beam path proximate to central axis 130.

In one implementation, position, shape, orientation, and/or magnetic field profile of the compensating magnet 210 can be substantially similar to at least one of the ion pump magnet position, ion pump magnet shape, ion pump magnet orientation, and ion pump magnet magnetic field profile. The compensating magnet 210 can also essentially be a copy of the ion pump magnet 110 in materials, model, construction, etc. This implementation is illustrated in FIG. 2 where a compensating magnet 210, substantially similar to the ion pump magnet 110, is positioned opposite the ion pump magnet 110. In this implementation, the orientation of the compensating magnet 210 can be described by performing a virtual rotation of the ion pump magnet 110 about the linear accelerator 100. In this way, orientation of the compensating magnet 210 can result in a magnetic field profile that is geometrically similar to the magnetic field of the ion pump magnet 110, but of substantially opposite polarity.

In another implementation, compensating magnet 210 can be an opposing magnet within a second ion pump (not shown). The second ion pump can be positioned in such a way to achieve the reduction of the magnetic field in linear accelerator 100 as described herein.

In yet another implementation, compensating magnet 210 can be current carrying coil(s) that generate a magnetic field. In this way the opposed current carrying coil(s) can act to cancel the magnetic field similar to opposing ion pump magnets.

Figure 3:
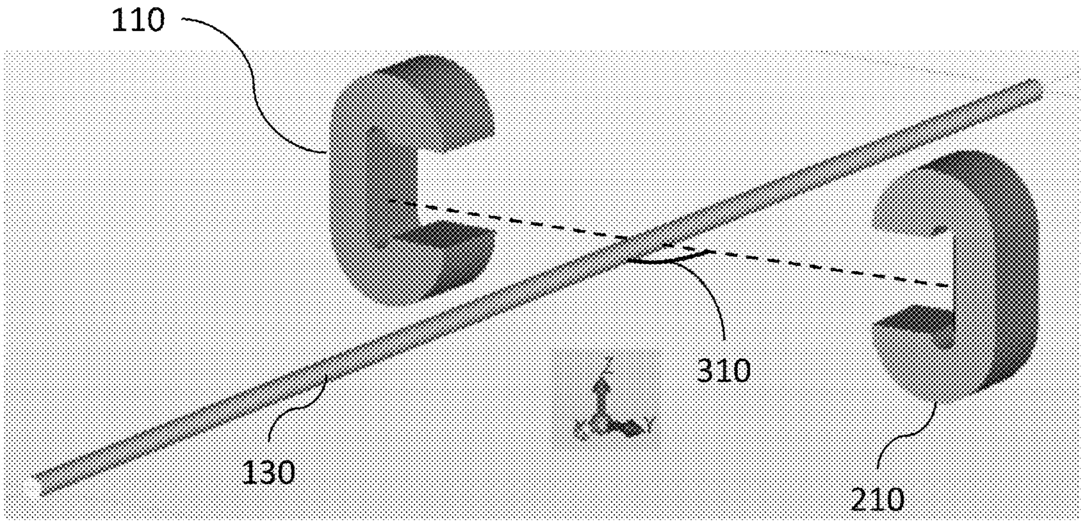
FIG. 3 is a perspective view illustrating an ion pump magnet and an embodiment of a compensating magnet in a face-to-face configuration.

FIG. 3 is a perspective view of illustrating the ion pump magnet 110 and compensating magnet 210 in a face-to-face configuration. In one implementation, shown in FIG. 2 and the simulation visualization in FIG. 3, ion pump magnet 110 and/or the compensating magnet 210 can each be generally C-shaped with an opening. In this implementation, openings of the C-shapes directly face each other. As also shown in FIG. 3, openings to the C-shapes are at an angle 310 of 90 degrees relative to the central axis 130 of the linear accelerator 100. In some implementations, such a configuration can result in an optimized reduction of the magnetic field.

Figure 4:
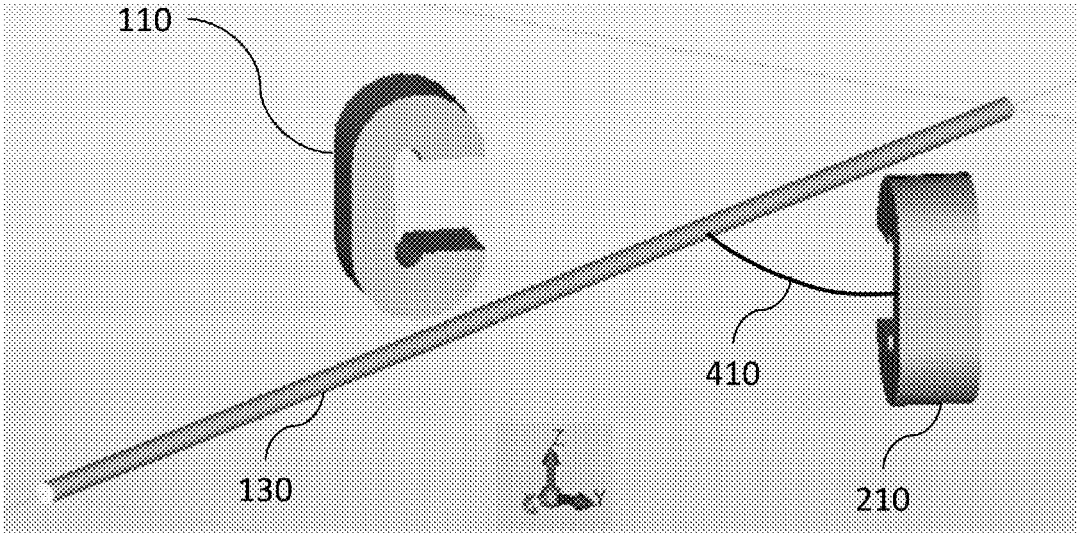
FIG. 4 is a perspective view illustrating an ion pump magnet and an embodiment of a compensating magnet in a 45 degree configuration.

FIG. 4 is a perspective view of an implementation illustrating ion pump magnet 110 and compensating magnet 210 in a 45 degree configuration. One implementation that can reduce a gradient of the magnetic field is shown in FIG. 4. The magnetic field gradient is a vector quantity that represents the direction and magnitude of the largest rate of change in the magnetic field strength. Determination of the magnetic field gradient in linear accelerator 100 can be simulated with mathematical models, measured by magnetic diagnostics, or inferred by other combinations of simulation and measurement.

The position, shape, orientation, and magnetic field profile of compensating magnet 210 can be configured to reduce the gradient of the magnetic field at one or more locations in the linear accelerator 100. Here, ion pump magnet 110 and compensating magnet 210 are oriented at an angle 310 of 45 degrees relative to central axis 130 of linear accelerator 100 to reduce the magnetic field gradient. While FIGS. 3 and 4 illustrate two implementations of ion pump magnet 110 and compensating magnet 210, there can be other implementations where they are oriented at other angles besides those shown.

Figure 5:
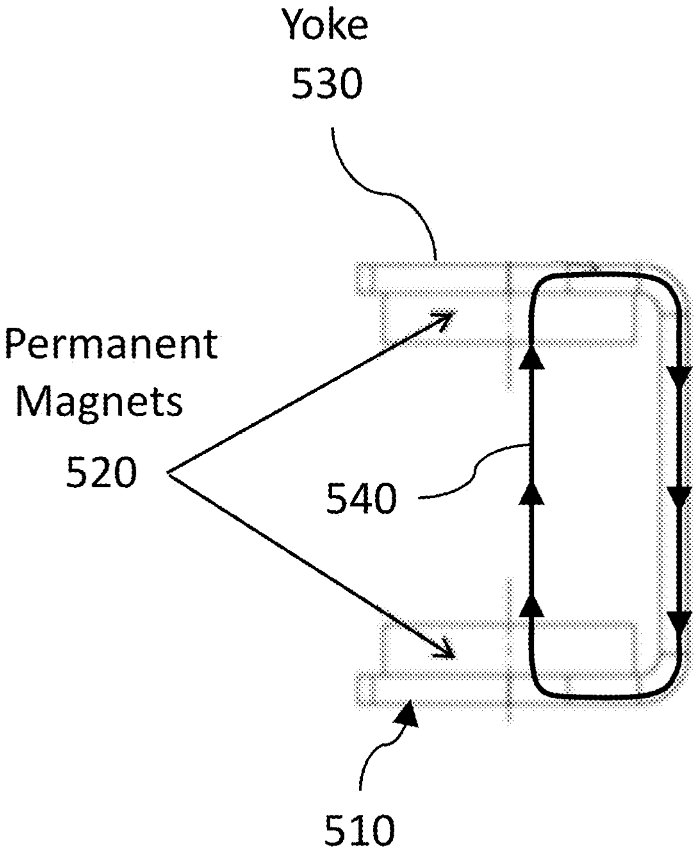
FIG. 5 is a side elevational view of a magnet formed by two permanent magnets connected by a yoke.

FIG. 5 is a side elevational view of a design that may be used for an ion pump and/or a compensating magnet. This example has two permanent magnets 520 connected by a yoke 530. Yoke 530 can be a ferromagnetic material that acts as a constraint for the magnetic field of permanent magnets 520. Such a construction can be advantageous because it can reduce stray magnetic fields. Without yoke 530, the magnetic field profile of permanent magnets 520 would resemble that of a dipole field. With the yoke 530, there can still be a reasonably uniform magnetic field between permanent magnets 520, however emerging magnetic field lines on the furthest opposing surfaces of the permanent magnets 520 remain preferentially confined to yoke 530. Such a confinement of magnetic field lines by yoke 530 is illustrated by magnetic field line 540 shown in FIG. 5.

The present disclosure contemplates that at least one of the position, shape, orientation, and magnetic field profile of the compensating magnet and at least one of the ion pump magnet position, ion pump magnet shape, ion pump magnet orientation, and ion pump magnet magnetic field profile are selected to cause the least reduction in a beam quality of the linear accelerator. For example, characteristics of the ion pump may be selected to minimize the effect of the ion pump magnet on the beam of the linear accelerator, while perhaps sacrificing the quality of the vacuum produced, but in a manner causing the least reduction in beam quality overall. In addition, the ion pump magnet and/or the compensating magnet may be preferentially placed closer to the linear accelerator's target than to its electron beam source.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above.

What is claimed is:

1. A system comprising:

a linear accelerator having a central axis;

an ion pump including an ion pump magnet having an ion pump magnet position, an ion pump magnet shape, an ion pump magnet orientation, and an ion pump magnet magnetic field profile; and a compensating magnet having a position, a shape, an orientation, and a magnetic field profile, wherein at least one of the position, shape, orientation, and magnetic field profile reduce at least one component of a magnetic field in the linear accelerator resulting from the ion pump magnet, wherein an ion pump magnet polarity and a compensating magnet polarity are substantially perpendicular to the central axis.

2. The system of claim 1, wherein at least one of the position, shape, orientation, and magnetic field profile of the compensating magnet is substantially similar to at least one of the ion pump magnet position, ion pump magnet shape, ion pump magnet orientation, and ion pump magnet magnetic field profile of the ion pump.

3. The system of claim 1, wherein the ion pump magnet and the compensating magnet each have a C-shape, each of the C-shapes having an opening, and wherein the openings of the C-shapes face each other.

4. The system of claim 1, wherein the linear accelerator has an electron beam path and the reduction of the at least one component of a magnetic field in the linear accelerator reduces the magnetic field along the electron beam path.

5. The system of claim 1, wherein at least one of the position, shape, orientation, and magnetic field profile of the compensating magnet are configured to reduce a gradient of the magnetic field in the linear accelerator.

6. The system of claim 1, wherein the compensating magnet is a current carrying coil.

7. The system of claim 1, wherein the orientation of the compensating magnet is such that the magnetic field due to the ion pump magnet is substantially canceled in at least one location in the linear accelerator.

8. The system of claim 1, wherein the linear accelerator has an electron beam path and the orientation of the compensating magnet is such that the magnetic field due to the ion pump magnet is substantially canceled along the electron beam path.

9. The system of claim 1, wherein at least one of the position, shape, orientation, and magnetic field profile of the compensating magnet and at least one of the ion pump magnet position, ion pump magnet shape, ion pump magnet orientation, and ion pump magnet magnetic field profile are selected to cause the least reduction in a beam quality of the linear accelerator.

10. The system of claim 1, wherein at least one of the ion pump magnet and the compensating magnet are located closer to a linear accelerator target than to a source of charged particles in the linear accelerator.

11. The system of claim 1, wherein the ion pump magnet orientation and the orientation of the compensating magnet are such that the ion pump magnet polarity and the compensating magnet polarity are substantially opposite to one another.

12. The system of claim 1, wherein the ion pump magnet and the compensating magnet are oriented at approximately 45 degrees relative to the central axis.

13. The system of claim 1, wherein at least one of the ion pump magnet and the compensating magnet further comprising a yoke.

14. The system of claim 13, wherein at least one of the ion pump magnet and the compensating magnet further comprising two permanent magnets, wherein the yoke connects the two permanent magnets.

* * * * *